United States Patent [19]

Chapman et al.

[11] Patent Number: 5,053,381

[45] Date of Patent: Oct. 1, 1991

[54] DUAL LAMINATE PROCESS FOR THERMAL COLOR PROOFING

[75] Inventors: Derek D. Chapman; Charles D. DeBoer, both of Rochester, N.Y.

[73] Assignee: Eastman Kodak Company, Rochester, N.Y.

[21] Appl. No.: 606,408

[22] Filed: Oct. 31, 1990

[51] Int. Cl.$^5$ .................. B41M 5/035; B41M 5/26
[52] U.S. Cl. ........................... 503/227; 8/471; 428/195; 428/211; 428/530; 428/913; 428/914
[58] Field of Search .................. 8/471; 428/195, 211, 428/913, 914, 530; 503/227

[56] References Cited

U.S. PATENT DOCUMENTS

| | | | |
|---|---|---|---|
| 4,600,669 | 7/1986 | Ng et al. | 430/47 |
| 4,716,144 | 12/1987 | Vanier et al. | 503/227 |
| 4,923,848 | 5/1990 | Akada et al. | 503/227 |

Primary Examiner—Bruce H. Hess
Attorney, Agent, or Firm—Andrew J. Anderson

[57] ABSTRACT

A process for forming a color image which may be used to represent a printed color image to be obtained from a printing press comprising (a) forming a thermal dye transfer image in a polymeric dye image-receiving layer of an intermediate dye-receiving element by imagewise-heating a dye-donor element and transferring a dye image to the dye image-receiving layer, (b) applying a dye-migration barrier layer to one surface of a paper substrate, and (c) transferring the imaged polymeric dye image-receiving layer to the surface of the paper having the dye-migration barrier layer applied thereon. By first applying a dye-migration barrier layer to the paper substrate, dye smear and spreading due to migration of dye into the paper can be eliminated and a high quality final color image can be obtained.

17 Claims, No Drawings

DUAL LAMINATE PROCESS FOR THERMAL COLOR PROOFING

This invention relates to a thermal dye transfer process for obtaining a color image which may be used to represent a printed image to be obtained from a printing press, and more particularly to the use of a dye migration barrier layer in the resulting color image to control dye smear.

In order to approximate the appearance of continuous-tone (photographic) images via ink-on-paper printing, the commercial printing industry relies on a process known as halftone printing. In halftone printing, color density gradations are produced by printing patterns of dots of various sizes, but of the same color density, instead of varying the color density uniformly as is done in photographic printing.

There is an important commercial need to obtain a color proof image before a printing press run is made. It is desired that the color proof will accurately represent the image quality, details, color tone scale and, in many cases, the halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled. U.S. Pat. No. 4,600,669 of Ng et al., for example, discloses an electrophotographic color proofing system.

In U.S. Pat. application No. 514,643, filed Apr. 25, 1990, of DeBoer, the disclosure of which is incorporated by reference, a thermal dye transfer process is described for producing a direct digital, halftone color proof of an original image. The proof is used to represent a printed color image obtained from a printing press. The process described therein comprises:

a) generating a set of electrical signals which is representative of the shape and color scale of an original image;

b) contacting a dye-donor element comprising a support having thereon a dye layer and an infrared-absorbing material with a first intermediate dye-receiving element comprising a support having thereon a polymeric, dye image-receiving layer;

c) using the signals to imagewise-heat by means of a diode laser the dye-donor element, thereby transferring a dye image to the first dye-receiving element; and d) retransferring the dye image to a second final dye image-receiving element which has the same substrate as the printed color image.

As set forth in U.S. Ser. No. 514,643 described above, an intermediate dye-receiving element is used with subsequent retransfer to a second receiving element to obtain the final color proof. This is similar to the electrophotographic color proofing system of Ng et al. referred to above, which discloses forming a composite color image on a dielectric support with toners and then laminating the color image and support to a substrate to simulate a color print expected from a press run. In both processes, the second or final receiving element can have the same substrate as that to be used for the actual printing press run. This allows a color proof to be obtained which most closely approximates the look and feel of the printed images that will be obtained in the actual printing press run. A multitude of different substrates can be used to prepare the color proof (the second receiver); however, there needs to be employed only one intermediate receiver.

For thermal dye transfer color proofing, the intermediate receiver can be optimized for efficient dye uptake without dye-smearing or crystallization. In the retransfer step, the dyes and receiver binder may be transferred together to the second receiver, or the dyes alone may be transferred where the second receiver is receptive to the dyes. Preferably, the dyes and receiver binder are transferred together to the final color proof receiver in order to maintain image sharpness and overall quality, which may be lessened when the dyes are retransferred alone to the final receiver. This is similar to the electrophotographic color proofing system of Ng et al. which discloses transferring a separable dielectric polymeric support layer together with the composite toner image from an electrophotographic element to the final receiver substrate.

While thermal dye transfer color proofing systems as described above have substantial advantages, it has been found that even where the transferred dyes and binder of the intermediate receiver are transferred together to the final color proof paper stock, a dye image spread or smear problem may result due to dyes migrating from the transferred binder to the paper stock. Such image smear can be particularly detrimental for halftone patterns in view of the minute dot size used to form such patterns. It would be desirable to provide a thermal dye transfer process for obtaining a high quality color proof which would minimize such a dye smear problem and which would be applicable to a variety of printer stock papers.

These and other objects of the invention are achieved in accordance with the process of this invention which comprises (a) forming a thermal dye transfer image in a polymeric dye image-receiving layer of an intermediate dye-receiving element by imagewise-heating a dye-donor element and transferring a dye image to the dye image-receiving layer, (b) applying a dye-migration barrier layer to one surface of a paper substrate, and (c) transferring the imaged polymeric dye image-receiving layer to the surface of the paper having the dye-migration barrier layer applied thereon. By applying a dye-migration barrier layer to the paper substrate prior to transfer of the imaged polymeric dye image-receiving layer, dye smear and spreading due to migration of dye into the paper can be eliminated and a high quality color image can be obtained.

The dye-donor element that is used in the process of the invention comprises a support having thereon a heat transferable dye-containing layer. The use of dyes in the dye-donor rather than pigments permits a wide selection of hue and color that enables a closer match to a variety of printing inks and also permits easy transfer of images one or more times to a receiver if desired. The use of dyes also allows easy modification of density to any desired level.

Any dye can be used in the dye-donor employed in the invention provided it is transferable to the dye-receiving layer by the action of the heat. Especially good results have been obtained with sublimable dyes such as anthraquinone dyes, e.g., Sumikalon Violet RS ® (product of Sumitomo Chemical Co., Ltd.), Dianix Fast Violet 3R-FS ® (product of Mitsubishi Chemical Industries, Ltd.), and Kayalon Polyol Brilliant Blue N-BGM ® and KST Black 146 ® (products of Nippon Kayaku Co., Ltd.); azo dyes such as Kayalon Polyol Brilliant Blue BM ®, Kayalon Polyol Dark Blue 2BM ®, and KST Black KR ® (products of Nippon Kayaku Co., Ltd.), Sumickaron Diazo Black 5G ® (product of Sumitomo Chemical Co., Ltd.), and Miktazol Black 5GH ® (product of Mitsui Toatsu Chemicals, Inc.); direct dyes such as Direct Dark Green B ® (product of Mitsubishi Chemical Industries, Ltd.) and Direct Brown M ® and Direct Fast Black D ® (products of Nippon Kayaku Co. Ltd.); acid dyes such as Kayanol Milling Cyanine 5R ® (product of Nippon Kayaku Co. Ltd.); basic dyes such as Sumicacryl Blue 6G ® (product of Sumitomo Chemical Co., Ltd.), and Aizen Malachite Green ® (product of Hodogaya Chemical Co., Ltd.); or any of the dyes disclosed in U.S. Pat. Nos. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination.

In color proofing in the printing industry, it is important to be able to match the proofing ink references provided by the International Prepress Proofing Association. These ink references are density patches made with standard 4-color process inks and are known as SWOP (Specifications Web Offset Publications) Color References. For additional information on color measurement of inks for web offset proofing, see "Advances in Printing Science and Technology", Proceedings of the 19th International Conference of Printing Research Institutes, Eisenstadt, Austria, June 1987, J. T. Ling and R. Warner, p.55. Preferred dyes and dye combinations found to best match the SWOP Color References are the subject matter of copending, commonly assigned U.S. Pat. Ser. Nos. 07/606,398, 07/606,399, and 07/606,395, of Chapman and Evans the disclosures of which are incorporated by reference.

The dyes of the dye-donor element employed in the invention may be used at a coverage of from about 0.05 to about 1 g/m$^2$, and are dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; a polycarbonate; polyvinyl acetate; poly(styrene-co-acrylonitrile); a poly(sulfone); a polyvinylacetal such as poly(vinyl alcohol-co-butyral) or a poly(phenylene oxide). The binder may be used at a coverage of from about 0.1 to about 5 g/m$^2$.

The dye layer of the dye-donor element may be coated on the support or printed thereon by a printing technique such as a gravure process.

Any material can be used as the support for the dye-donor element employed in the invention provided it is dimensionally stable and can withstand the heat needed to transfer the sublimable dyes. Such materials include polyesters such as poly(ethylene terephthalate): polyamides; polycarbonates; cellulose esters such as cellulose acetate; fluorine polymers such as polyvinylidene fluoride or poly(tetrafluoroethylene-cohexafluoropropylene); polyethers such as polyoxymethylene; polyacetals; polyolefins such as polystyrene, polyethylene, polypropylene or methylpentane polymers; and polyimides such as polyimide-amides and polyetherimides. The support generally has a thickness of from about 5 to about 200 μm. It may also be coated with a subbing layer, if desired, such as those materials described in U.S. Pat. Nos. 4,695,288 or 4,737,486.

The intermediate or first dye-receiving element that is used in the process of the invention comprises a support having thereon a dye image-receiving layer. The support may be a polymeric film such as a poly(ether sulfone), a polyimide, a cellulose ester such as cellulose acetate, a poly(vinyl alcohol-co-acetal) or a poly(ethylene terephthalate). The intermediate support thickness is not critical, but should provide adequate dimensional stability. In general, polymeric film supports of from 5 to 500 μm are used. The intermediate dye-receiving element support may be clear, opaque, and/or diffusely or specularly reflective. Opaque (e.g. resin coated paper) and reflective (e.g. metal coated polymeric film) supports are preferred when a laser system is used to form the dye image in the dye image-receiving layer, and such supports are the subject matter of copending, commonly assigned U.S. Ser. 07/606,404 of Kaszczuk et al., the disclosure of which is incorporated by reference.

The dye image-receiving layer may comprise, for example, a polycarbonate, a polyurethane, a polyester, polyvinyl chloride, cellulose esters such as cellulose acetate butyrate or cellulose acetate propionate, poly(styrene-co-acrylonitrile), poly(caprolactone), polyvinyl acetals such as poly(vinyl alcohol-co-butyral), mixtures thereof, or any other conventional polymeric dye-receiver material provided it will adhere to the second receiver. The dye image-receiving layer may be present in any amount which is effective for the intended purpose. In general, good results have been obtained at a concentration of from about 0.2 to about 5 g/m$^2$.

The dye-donor elements employed in the invention may be used with various methods of heating in order to transfer dye to the intermediate receiver. For example, a resistive thermal head or a laser may be used.

When a laser is used, it is preferred to use a diode laser since it offers substantial advantages in terms of its small size, low cost, stability, reliability, ruggedness, and ease of modulation. In practice, before any laser can be used to heat a dye-donor element, the element must contain an infrared-absorbing material. The laser radiation is then absorbed into the dye layer and converted to heat by a molecular process known as internal conversion.

Lasers which can be used to transfer dye from dye-donors employed in the invention are available commercially. There can be employed, for example, Laser Model SDL-2420-H2 from Spectro Diode Labs, or Laser Model SLD 304 V/W from Sony Corp.

In the above process, multiple dye-donors may be used to obtain a complete range of colors in the final image. For example, for a full-color image, four colors: cyan, magenta, yellow and black are normally used.

Thus, in a preferred embodiment of the process of the invention, a dye image is transferred by imagewise heating a dye-donor containing an infrared-absorbing material with a diode laser to volatilize the dye, the diode laser beam being modulated by a set of signals which is representative of the shape and color of the original image, so that the dye is heated to cause volatilization only in those areas in which its presence is required on the dye-receiving layer to reconstruct the color of the original image.

Spacer beads may be employed in a separate layer over the dye layer of the dye-donor in the above-described laser process in order to separate the dye-donor from the dye-receiver during dye transfer, thereby increasing its uniformity and density. That invention is more fully described in U.S. Pat. No. 4,772,582, the disclosure of which is hereby incorporated by reference. Alternatively, the spacer beads may be employed in or on the receiving layer of the dye-receiver as described in U.S. Pat. No. 4,876,235, the disclosure of which is hereby incorporated by reference. The spacer beads may be coated with a polymeric binder if desired.

In a further preferred embodiment of the invention, an infrared-absorbing dye is employed in the dye-donor element instead of carbon black in order to avoid desaturated colors of the imaged dyes from carbon contamination. The use of an absorbing dye also avoids problems of uniformity due to inadequate carbon dispersing. For example, cyanine infrared absorbing dyes may be employed as described in DeBoer U.S. Pat. application Ser. No. 463,095, filed Jan. 10, 1990, the disclosure of which is hereby incorporated by reference. Other materials which can be employed are described in the following 07/ series U.S. Pat. application Ser. Nos.: 366,970, 367,062, 366,967, 366,968, 366,969, 367,064, 367,061, 369,494, 366,952, 369,493, 369,492, and 369,491.

A thermal printer which uses the laser described above to form an image on a thermal print medium is described and claimed in copending U.S. Pat. application Ser. No. 451,656 of Baek and DeBoer, filed Dec. 18, 1989, the disclosure of which is hereby incorporated by reference.

As noted above, after the dye image is obtained on a first dye-receiving element, it is retransferred to a second or final receiving element in order to obtain a final color proof. The final receiving element comprises a paper substrate to which has been applied a dye-migration barrier layer. The substrate thickness is not critical and may be chosen to best approximate the prints to be obtained in the actual printing press run. Examples of substrates which may be used for the final receiving element (color proof) include the following: Ad-proof ® (Appleton Paper), Flo Kote Cove ® (S. D. Warren Co.), Champion Textweb ® (Champion Paper Co.), Quintessence Gloss ® (Potlatch Inc.), Vintage Gloss ® (Potlatch Inc.), Khrome Kote ® (Champion Paper Co.), Consolith Gloss ® (Consolidated Papers Co.) and Mountie Matte ® (Potlatch Inc.).

The dye-migration barrier layer may be any material which limits the tendency of the transferred halftone dye image dots from spreading due to migrating into the paper substrate. Materials generally useful are those used as polymeric binders in the dye layer of the dye-donor element described above and polymers used for the dye image-receiving layer of the intermediate dye-receiving element. The dye-migration barrier layer is preferably thin so as to not affect the appearance of the final color image, while still thick enough to provide adequate protection against migration of the dye image into the paper substrate. In general, coverages of from 0.1 to 5 g/m$^2$ are preferred for polymeric dye-migration barrier layers.

The dye-migration barrier layer may be applied to the paper substrate by any conventional method such as extrusion coating, solvent coating, or lamination. In a preferred embodiment, the dye-migration barrier layer is a polymeric layer preformed on a support, which is then laminated to the paper substrate. The support can then be separated from the dye-migration barrier layer. This layer application can be accomplished, for example, by passing the paper substrate and the polymeric dye-migration barrier layer with support between a pair of heated rollers to form a laminate, and then stripping the support away. Other methods of transferring the dye-migration barrier layer from its support to the final receiver substrate could also be used such as using a heated platen, using a resistive thermal head, other conventional use of pressure and/or heat, external heating, etc. To facilitate separation, release agents may be included within or between the dye-migration barrier layer and its support. For example, conventional silicone based materials or hydrophilic cellulosic materials may be used. Useful supports for the dye-migration barrier layer include those listed above for the intermediate dye-receiving element.

The imaged, intermediate dye image-receiving layer may be transferred to the final receiver (color proof substrate with dye-migration barrier layer) in a similar manner of passing between two heated rollers, use of a heated platen, use of a resistive thermal head, use of other forms of pressure and/or heat, external heating, etc., to form a laminate with the imaged intermediate dye image-receiving layer adhered to the dye-migration barrier layer. Preferably, the intermediate receiver element support is separated from the dye-image receiving layer after it is laminated to the paper substrate. Release agents as described above may also be included between or within the intermediate receiver support and dye image-receiving layer to facilitate separation. The use of release layers comprising mixtures of hydrophilic cellulosic materials and polyethyleneglycol between metal coated supports and dye image-receiving layers is the subject matter copending, commonly assigned U.S. Ser. No. 07/606,400 of Henzel, the disclosure of which is incorporated by reference.

Also as noted above, a set of electrical signals is generated which is representative of the shape and color of an original image. This can be done, for example, by scanning an original image, filtering the image to separate it into the desired basic colors (red, blue and green), and then converting the light energy into electrical energy. The electrical signals are then modified by computer to form the color separation data which may be used to form a halftone color proof. Instead of scanning an original object to obtain the electrical signals, the signals may also be generated by computer. This process is described more fully in Graphic Arts Manual, Janet Field ed., Arno Press, New York 1980 (p. 358ff), the disclosure of which is hereby incorporated by reference.

The dye-donor element employed in the invention may be used in sheet form or in a continuous roll or ribbon. If a continuous roll or ribbon is employed, it may have alternating areas of different dyes or dye mixtures, such as sublimable cyan and/or yellow and/or magenta and/or black or other dyes. Such dyes, for example, are disclosed in the co-pending applications referred to above.

The following examples are provided to illustrate the invention.

EXAMPLE 1

A dye-donor element, A, was prepared by coating on a 100 μm poly(ethylene terephthalate) support a subbing layer of poly(acrylonitrile-covinylidene chloride-co-acrylic acid)(14:79:7 wt ratio) (0.07 g/m$^2$) and a dye-layer of the following magenta dye (0.27 g/m$^2$)

with the following cyanine infrared absorbing dye (0.054 g/m²) in a cellulose acetate propionate binder (2.5% acetyl, 45% propionyl) (0.27 g/m²) from dichloromethane.

Donor A: Pyrazolylaniline Magenta Dye

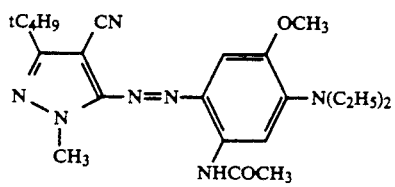

Cyanine Infrared Absorbing Dye

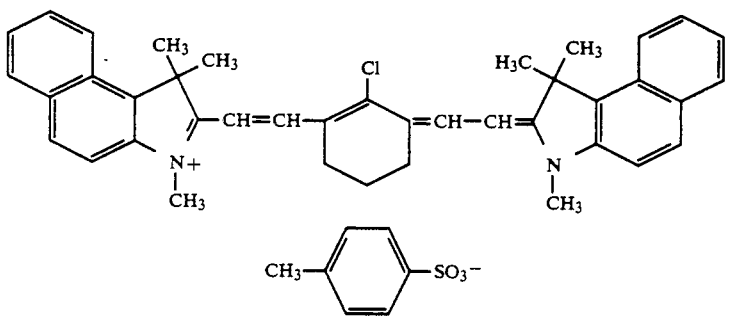

An intermediate dye-receiving element was prepared by coating on an unsubbed 100 μm thick poly (ethylene terephthalate) support a layer of crosslinked poly(styrene-co-divinylbenzene) beads (14 micron average diameter)(0.11 g/m²), triethanolamine (0.09 g/m²) and DC-510 ® Silicone Fluid (Dow Corning Company)(0.01 g/m²) in a Butvar ® 76 poly(vinyl alcohol-co-butyral) binder (Monsanto Company)(4.0 g/m²) from a 1,1,2-trichloroethane and dichloromethane solvent mixture.

A second or final receiving element was prepared on a paper stock representing the substrate used for a printed ink image obtained from a printing press. A coated layer of poly(styrene-co-divinylbenzene) beads and silicone fluid in a poly(vinyl alcohol-co-butyral) binder on a 100 μm thick poly(ethylene terephthalate) support, the same as used for the intermediate receiving element described above, was laminated to Adproof ® (Appleton Paper) 60 pound paper stock by a single passage through a set of heated moving rollers at 120° C. (polymer coated side of intermediate receiver in contact with paper stock). The poly(ethylene terephthalate) support was peeled off and discarded leaving a dye-migration barrier overlayer of poly(vinyl alcohol-co-butyral) on one side of the paper stock.

As a control second or final receiving element, Adproof ® paper stock without any dye migration barrier layer was used.

A half-tone test image of a 59 lines/cm (150 lines/in) square dot pattern with touching corners to cover half of an image (50% dot pattern known as a tint) was generated by computer to provide the input for imaging. See Graphic Arts Manual, Janet Field, et al, Arno Press: New York, 1980, p 358ff.

Single color half-tone images were printed as described below from dye-donors onto the intermediate receiver using a laser imaging device as described in U.S. Pat. No. 4,876,235. The laser imaging device consisted of a single diode laser connected to a lens assembly mounted on a translation stage and focussed onto the dye donor layer.

The intermediate dye receiving element was secured to the drum of the diode laser imaging device with the receiving layer facing outward. The dye donor element was secured in face to face contact with the dye receiving element.

The diode laser used was a Spectra Diode Labs No. SDL-2430-H2, having an integral, attached optical fiber for the output of the laser beam, with a wavelength of 816 nm and a nominal power output of 250 milliwatts at the end of the optical fiber. The cleaved face of the optical fiber (100 microns core diameter) was imaged onto the plane of the dye donor with a 0.33 magnification lens assembly mounted on a translation stage giving a nominal spot size of 33 microns and a measured power output at the focal plane of 115 milliwatts.

The drum, 312 mm in circumference, was rotated at 500 rpm as the imaging electronics were activated. The translation stage was incrementally advanced across the dye donor by means of a lead screw turned by a microstepping motor, to give a center-to-center line distance of 14 microns (714 lines per centimeter, or 1810 lines per inch). A half-tone image of a uniform dot pattern of 50% tint (equal areas of dot and clear areas) was generated.

After imaging, the intermediate receiver was separated from the dye-donor. The image produced consisted of a magenta dye square dot pattern approximately one cm wide. This imaged intermediate receiver was laminated (polymer side to polymer side) to the final receiver with polymer overlayer on the paper stock by a single passage through a set of heated moving rollers at 120° C. The poly(ethylene terephthalate) support of the intermediate receiver was peeled off and discarded. These lamination and imaging steps thus produced a half-tone dye image between or within two laminated poly(vinyl alcohol-co-butyral) layers on a paper stock.

Image smear or spread of the dot pattern was evaluated by determining the integrated image density with a large aperture densitometer before and after incubation. The half-tone image square dot pattern was only 59 lines/cm or each square of the pattern was also 0.012 cm on edge, the reading aperture of the densitometer was 0.5 cm or 0.2 cm². Thus the densitometer reads the average density over a 700 dot area, including both light and dark parts of the dots. When the image dots spread, there is an observed increase in the covering power and an increase in the Status A Green density. No image spread or change in dot size produces no change in density. Examination of the samples before and after incubation with a magnifier also confirmed the validity of this test. Relative image spread was evaluated by reading the Status A Green density after transfer, and determining the difference in density of the same area after incubation at 49° C., 50% RH for 7 days. To eliminate positioning errors 3 to 5 separate density readings were averaged. The following results were obtained (TABLE I):

TABLE I

| Receiver with Polymer Overlayer Status A Green Density | | | Paper Receiver Only (Control) Status A Green Density | | |
| --- | --- | --- | --- | --- | --- |
| Initial | After Incub. | Change | Initial | After Incub. | Change |
| 0.62 | 0.62 | 0 | 0.62 | 0.82 | +0.20 |

The above data show image smear of a thermal transfer dot-image is minimized when an imaged polymeric receiver layer is laminated to a paper stock receiver with a dye-migration barrier overlayer of the same polymer compared to a paper stock receiver without such an overlayer. Also the final receiver with polymer overlayer, unlike the control, did not show any evidence of dye-migration to the back of the receiver.

EXAMPLE 2

This example is similar to Example 1 but uses different dyes in the dye-donor.

Dye-donor elements were prepared as in Example 1 with an imaging dye and cyanine infrared absorbing dye in binder, except each of the following dyes (0.27 g/m²) was coated instead of the magenta dye of Example 1.

Donor B: Yellow Arylidene-malononitrile Dye

Donor C: Yellow Arylidene-pyrazolinone Dye

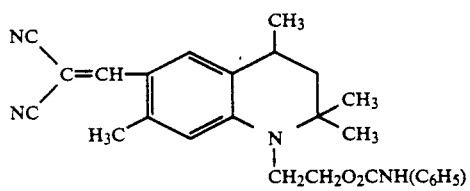

Donor D: Yellow Merocyanine Dye

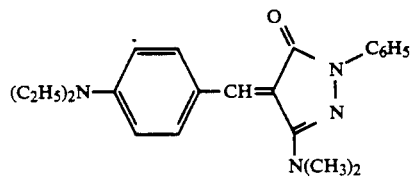

Donor E: Magenta Pyrazolylazoaniline Dye

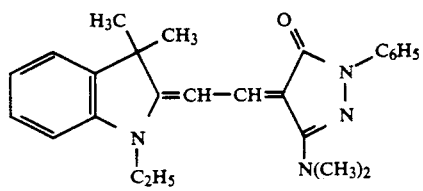

Donor F: cyan Tricyanopropene-azomethine Dye

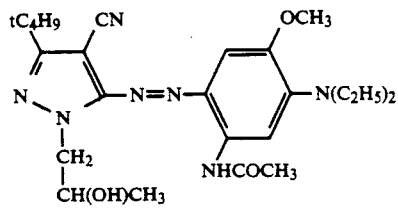

Donor G: Cyan Indophenole-azamethine Dye

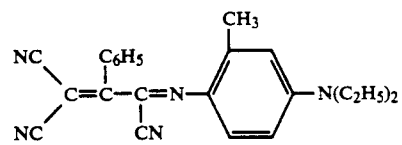

Donor H: Cyan Indophenol-azamethine Dye

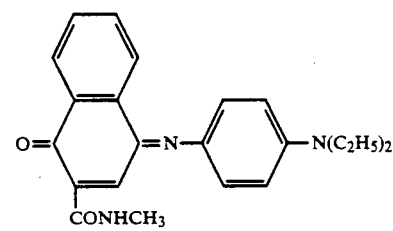

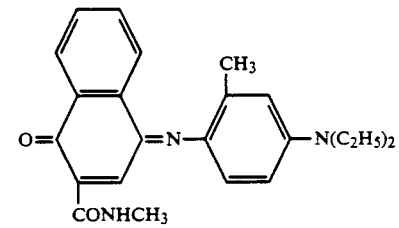

An intermediate dye-receiving element was prepared as described in Example 1.

Final receiving elements were prepared by lamination as described in Example 1. The paper stock used was Adproof ® (Appleton Paper) 60 pound paper stock. Poly(vinyl alcohol-co-butyral) was the polymeric dye-migration barrier overlayer of each of these second receivers and was also used as the polymeric dye image-receiving layer for each of the intermediate receivers.

Control second or final receiving elements consisted only of the paper stock listed above, without any polymeric overlayer.

A single-color 50% tint half-tone image was produced on the intermediate receiver from each of the dye-donors by laser dye-transfer as described in Example 1. Lamination to either the paper stock with polymeric overlayer or the control paper stock was as described in Example 1. The same densitometric evaluation was made after incubation as described in Example 1 except Status A Red, Green, or Blue density was read depending upon whether the dye was cyan, magenta, or yellow. The following results were obtained (TABLE II):

TABLE II

| | Receiver with Polymer Overlayer Status A Density | | | Paper Receiver Only (Control) Status A Density | | |
|---|---|---|---|---|---|---|
| Donor | Initial | After Incub. | Change | Initial | After Incub. | Change |
| B | 0.55 | 0.54 | −0.01* | 0.55 | 0.64 | +0.09 |
| C | 0.73 | 0.72 | −0.01* | 0.69 | 0.74 | +0.05 |
| D | 0.71 | 0.71 | 0 | 0.66 | 0.78 | +0.12 |
| E | 0.64 | 0.64 | 0 | 0.63 | 0.76 | +0.13 |
| F | 0.68 | 0.67 | −0.01* | 0.68 | 0.91 | +0.23 |
| G | 0.58 | 0.57 | −0.01* | 0.62 | 0.72 | +0.10 |
| H | 0.53 | 0.53 | 0 | 0.58 | 0.66 | +0.08 |

*Negative values at this level are considered zero within reading error.

The data above show that smear is a problem with a variety of dyes that may be transferred as a half-tone dot-image from an intermediate receiver to a paper stock receiver. The tendency of all dyes to smear is minimized by use of a receiver with a polymeric overlayer that is laminated to the intermediate receiver to produce a half-tone image between or within two laminated polymeric layers.

EXAMPLE 3

This example is similar to Example 2 but uses a different polymer in the intermediate receiver and the second receiver. After imaging, however, the same polymers are laminated together.

Dye-donor elements, D and F, were prepared as described in Example 2.

Intermediate dye-receiving elements were prepared as described in Example 1 except different polymers were used. For one receiver the polymer used was poly(vinyl alcohol-co-benzal)(57 mole % benzal, 40 mole % hydroxyl, 3 mole % acetate, approx. mw=120 to 150,000) (2.2 g/m$^2$). Poly(vinyl alcohol-co-benzal) is another example of the polyvinylacetal class of polymers. The preparation of these type of polymers is described in Kirk-Othmer, Encyclopedia of Chemical Technology Vol. 23, p. 801. For the other receiver the polymer used was cellulose acetate butyrate (2% acetyl, 50% butyryl) (2.2 g/m$^2$).

Second or final receiving elements were prepared similarly as in Example 1 by laminating these polymers to paper substrates. The paper stock used for the poly(vinyl alcohol-co-benzal) was Adproof® (Appleton Papers) 60 pound paper stock; the paper stock used for the cellulose acetate butyrate was Quintessence Gloss® (Potlatch Co.) 80 pound paper stock.

Control second or final receiving elements consisted only of the two paper stocks without any polymeric overlayer.

A single-color 50% tint half-tone image was produced on the intermediate receiver from each of the dye-donors by laser dye-transfer as described in Example 1. Lamination to either the paper stock with polymeric overlayer or the control paper stock was as described in Example 1. The same densitometric evaluation was made after incubation as described in Example 1, and Status A Red or Blue densities were read as appropriate to the dye. The following results were obtained (TABLE III):

TABLE III

| | Receiver with Polymer Overlayer Status A Density | | | Paper Receiver Only (Control) Status A Density | | |
|---|---|---|---|---|---|---|
| Donor | Initial | After Incub. | Change | Initial | After Incub. | Change |
| F (I) | 0.73 | 0.71 | −0.02 | 0.74 | 1.07 | +0.33 |
| D (II) | 0.65 | 0.73 | +0.08 | 0.60 | 0.93 | +0.33 |

(I) Laminate of final receiver/intermediate receiver of poly(vinyl alcohol-co-benzal) with a cyan dye image.
(II) Laminate of final receiver/intermediate receiver of cellulose acetate butyrate with a yellow dye image.

The data above show that a low-degree of image smear is also obtained when a transferred dye image is between or within two laminated poly(vinyl alcohol-co-benzal) or cellulose acetate butyrate layers on a paper stock.

EXAMPLE 4

This example is similar to Example 3 but uses separate and distinct polymers in each intermediate and second receiver. Thus after imaging two different polymers are laminated together.

Dye-donor elements, A, D and F, were prepared as described in Examples 1 and 2.

Intermediate dye-receiving elements were prepared as described in Example 3. In addition to the poly(vinyl alcohol-co-benzal) and cellulose acetate butyrate receiving polymers of Example 3, an intermediate receiver using a polyesterionomer was prepared. The specific material was AQ38 (Eastman Organic Chemicals), a terpolymer of three esters; diethyleneglycol reacted with isophthalic acid, ethylene glycol reacted with isophthalic acid, and 5-sulfoisophthalic acid (sodium salt) reacted with diethylene glycol in a 67:22:11 mole ratio. Each of these receiver polymers were coated at 2.2 g/m$^2$.

Final receiving elements were prepared as described in Example 1 by lamination. The final receiver in all cases was poly(vinyl alcohol-co-butyral) laminated to one of three paper stocks: Adproof® (Appleton Paper) (60 pound); Quintessence Gloss® (Potlatch Co)(80 pound); or Textweb® (Champion Paper Co)(60 pound).

Control second or final receiving elements consisted only of these three paper stocks without any polymeric overlayer.

A single-color 50% tint half-tone image was produced on the intermediate receiver from each of the dye-donors by laser dye-transfer as described in Example 1. Lamination to either the paper stock with polymeric overlayer or the control paper stock was as described in Example 1. The same densitometric evaluation was made after incubation as described in Example 1, and Status A Red, Blue, or Green densities were read as appropriate to the dye. The following results were obtained (TABLE IV):

TABLE IV

| | Receiver with Polymer Overlayer Status A Density | | | Paper Receiver Only (Control) Status A Density | | |
|---|---|---|---|---|---|---|
| Donor | Initial | After Incub. | Change | Initial | After Incub. | Change |
| F (I) | 0.80 | 0.83 | +0.03 | 0.74 | 1.07 | +0.33 |
| D (II) | 0.58 | 0.61 | +0.03 | 0.60 | 0.93 | +0.33 |

TABLE IV-continued

| | Receiver with Polymer Overlayer Status A Density | | | Paper Receiver Only (Control) Status A Density | | |
|---|---|---|---|---|---|---|
| Donor | Initial | After Incub. | Change | Initial | After Incub. | Change |
| A (III) | 0.72 | 0.74 | +0.02 | * | * | * |

*No actual density readings were obtained, but the image smear was visually observable.
(I) Laminate of final receiver overlayer of poly (vinyl alcohol-co-butyral)/intermediate receiver of poly (vinyl alcohol-co-benzal) with a cyan dye image (final receiver overlayer on Adproof ® Paper).
(II) Laminate of final receiver overlayer of poly (vinyl alcohol-co-butyral)/intermediate receiver of cellulose acetate butyrate with a yellow dye image (final receiver overlayer on Quintessence ® Paper).
(III) Laminate of final receiver overlayer of poly (vinyl alcohol-co-butyral)/intermediate receiver of polyesterionomer AQ polymer with a magenta dye image (final receiver overlayer on Textweb ® Paper).

The data above show that a low degree of image smear is obtained when a transferred dye image is between or within two dissimilar laminated layers on a paper stock.

The invention has been described in detail with particular reference to preferred embodiments thereof, but it will be understood that variations and modifications can be effected within the spirit and scope of the invention.

What is claimed is:

1. A process for forming a color image comprising:
   (a) forming a thermal dye transfer image in a polymeric dye image-receiving layer of an intermediate dye-receiving element by imagewise-heating a dye-donor element and transferring a dye image to the dye imagereceiving layer,
   (b) applying a polymeric dye-migration barrier layer to one surface of a paper substrate, and
   (c) transferring the imaged polymeric dye image-receiving layer to the surface of the paper substrate having the dye-migration barrier layer applied thereon.

2. The process of claim 1 wherein the polymeric dye-migration barrier layer is applied to the paper substrate by heat lamination.

3. The process of claim 1 wherein step (b) comprises laminating an element comprising a support having on one surface thereof the polymeric dye-migration barrier layer to the paper substrate such that the barrier layer is adhered to the paper substrate, and thereafter separating the support from the barrier layer.

4. The process of claim 1 wherein the intermediate receiver element comprises an intermediate support bearing on one surface thereof the dye image-receiving layer, and wherein step (c) comprises laminating the intermediate receiver element to the paper substrate such that the imaged dye image-receiving layer is adhered to the dye-migration barrier layer, and thereafter separating the intermediate support from the dye image-receiving layer.

5. The process of claim 4 wherein the polymeric dye-migration barrier layer is applied to the paper substrate by heat lamination.

6. The process of claim 4 wherein step (b) comprises laminating an element comprising a support having on one surface thereof the polymeric dye-migration barrier layer to the paper substrate such that the barrier layer is adhered to the paper substrate, and thereafter separating the support from the barrier layer.

7. The process of claim 6 wherein the polymeric dye-migration barrier layer and the polymeric dye image-receiving layer both comprise the same polymer.

8. The process of claim 7 wherein the polymer is a poly(vinyl alcohol-co-butyral).

9. The process of claim 6 wherein the polymeric dye-migration barrier layer and the polymeric dye image-receiving layer comprise different polymers.

10. The process of claim 1 wherein step (a) comprises
    (i) generating a set of electrical signals which is representative of the shape and color scale of an original image,
    (ii) contacting a dye-donor element comprising a support having thereon a dye layer and an infrared-absorbing material with an intermediate dye-receiving element comprising an intermediate support having thereon the polymeric dye image-receiving layer, and
    (iii) using the signals to imagewise-heat by means of a diode laser the dye-donor element, thereby transferring a dye image to the intermediate dye-receiving element.

11. The process of claim 10 wherein the thermal dye transfer image comprises a half-tone color image.

12. The process of claim 1 wherein the thermal dye transfer image comprises a half-tone color image.

13. A color image comprising a paper sheet having on one surface thereof a polymeric dye-migration barrier layer and a thermal dye transfer imaged polymeric dye image-receiving layer in that order, such that the thermal dye transfer image is contained between the image-receiving layer and the dye-migration barrier layer.

14. The color image of claim 13 wherein the polymeric dye-migration barrier layer and the polymeric dye image-receiving layer both comprise the same polymer.

15. The color image of claim 14 wherein the polymer is a poly(vinyl alcohol-co-butyral).

16. The color image of claim 13 wherein the polymeric dye-migration barrier layer and the polymeric dye image-receiving layer comprise different polymers.

17. The color image of claim 13 wherein the thermal dye transfer image comprises a half-tone color image.

* * * * *